United States Patent [19]

Miyazaki

[11] Patent Number: 4,689,653

[45] Date of Patent: Aug. 25, 1987

[54] COMPLEMENTARY MOS INTEGRATED CIRCUIT INCLUDING LOCK-UP PREVENTION PARASITIC TRANSISTORS

[75] Inventor: Yukio Miyazaki, Hyogo, Japan

[73] Assignee: Mitsubishi Denki Kabushiki Kaisha, Tokyo, Japan

[21] Appl. No.: 769,092

[22] Filed: Aug. 26, 1985

Related U.S. Application Data

[63] Continuation of Ser. No. 436,479, Oct. 25, 1982, abandoned.

[30] Foreign Application Priority Data

Oct. 27, 1981 [JP] Japan .................. 56-173825

[51] Int. Cl.[4] ............................................. H01L 27/02
[52] U.S. Cl. ........................................ 357/42; 357/41; 357/44
[58] Field of Search ............................. 357/41, 42, 44

[56] References Cited

U.S. PATENT DOCUMENTS

| | | | |
|---|---|---|---|
| 3,573,509 | 4/1971 | Crawford | 357/41 X |
| 3,955,210 | 5/1976 | Bhatia et al. | 357/42 X |
| 4,173,767 | 11/1979 | Stevenson | 357/42 X |
| 4,327,368 | 4/1982 | Uchida | 357/42 |

FOREIGN PATENT DOCUMENTS

| | | | |
|---|---|---|---|
| 52-38890 | 3/1977 | Japan | 357/42 |
| 53-126280 | 11/1978 | Japan | 357/42 |

Primary Examiner—Andrew J. James
Assistant Examiner—William Mintel
Attorney, Agent, or Firm—Sughrue, Mion, Zinn, Macpeak, and Seas

[57] ABSTRACT

In a complementary MOS-IC (CMOSIC) comprising a p-channel MOS transistor with an n-channel MOS transistor serially connected thereto, a third diffusion layer is provided being of a conductivity type similar to that of the drains of the respective transistors. This third diffusion layer produces a plurality of parasitic bipolar transistors which limit the gain of the naturally occurring parasitic transistors in the CMOSIC. By limiting the gain, the third diffusion layer drastically reduces the chance of CMOSIC breakdown upon the occurence of high input transients.

6 Claims, 7 Drawing Figures

COMPLEMENTARY MOS INTEGRATED CIRCUIT INCLUDING LOCK-UP PREVENTION PARASITIC TRANSISTORS

This is a continuation, of application Ser. No. 436,479, filed 10/25/82 now abandoned.

BACKGROUND OF THE INVENTION

This invention relates to a semiconductor integrated circuit device and, particularly, to an improvement in a complementary MOS integrated circuit device (hereinafter referred to as a CMOSIC).

The CMOSIC, which exhibits low power consumption and a wide operating source voltage range, has enjoyed widespread use in the industry over the past several years. The CMOSIC of the prior art comprises a p-channel MOS transistor (p-MOST) and an n-channel MOS transistor (n-MOST) formed on a common substrate. As such, a parasitic bipolar transistor is formed between the p-type and n-type diffusion layers forming the transistors. This parasitic bipolar transistor causes the so-called "latch-up" phenomenon to occur which causes the CMOSIC element to break down. This is the most important defect of the CMOSIC devices of the prior art.

FIG. 1 is an equivalent circuit diagram of a minimum unit of the CMOS circuit, in which A is a p-MOST having a source 101 and a drain 102, and B is an n-MOST having an source 103 and a drain 104. The source 101 of the p-MOST A is connected to a voltage source terminal $V_{DD}$ and the source 103 of the n-MOST B is connected to a voltage source terminal $V_{SS}$. The gates of the MOSTs A and B are connected to a common input terminal IN, and the drains 102 and 104 respectively are connected to a common output terminal OUT.

FIG. 2 is a cross-sectional view of a conventional CMOSIC which provides the circuit equivalent of FIG. 1 and comprises a n-type semiconductor substrate 105 including a p-type island 106 forming the n-MOST B, an insulating layer 107 formed on the substrate, metal electrodes 108, a p+ type contact layer 109 for the source terminal $V_{SS}$ and an n+ type contact layer 110 for the source terminal $V_{DD}$.

In such a CMOSIC as described above, the parasitic bipolar transistors and resistors which contribute to the latch-up phenomenon are shown by dotted lines. One parasitic transistor 1 of pnp type is formed between the p+ type source region 101 of the p-MOST A, the p-island 106 and the n-type substrate 105. Parasitic transistor 2 of pnp type is formed between the p drain region 102 of the p-MOST A, the p-type island 106 and the n-type substrate 105. A third parasitic transistor 3 of npn type is formed between the n+ type source region 103 of the n-MOST B, the p-type island 106 and n-type substrate 105, and a fourth parasitic transistor 4 of npn type is formed between the n+ type drain regions 104 of the n-MOST B, the p-type island 106 and the n-type substrate 105. A first parasitic resistor 5 is produced from the substrate through the n+ diffusion layer 110 to the source terminal $V_{DD}$, a second resistor 6 is produced within the p+ type source regions 101 of the p-MOST A, a third resistor 7 is produced from the substrate through the p-type island 109 to the source terminal $V_{SS}$, and a fourth resistor 8 is produced within the n+ type source region 103 of the n-MOST B.

FIG. 3 shows the circuit diagram of these parasitic elements formed in the CMOSIC. The above-mentioned latch-up phenomenon will now be described with reference to FIGS. 2 and 3.

When a negative surge voltage is applied to the output terminal OUT, a forward current flows between the p-type island 106 and the n+ type drain 104 of the n-MOST B. With this forward current, the npn transistor 4 turns on, causing a current which is the forward current amplified by the amplification factor $h_{FE}$ of the npn transistor 4 to flow $h_{FE4}$ from the source terminal $V_{DD}$ through the resistor 5 and the n-type substrate 105 to the n+ type drain 104 of the n-MOST B.

With this current, the junction between the base and emitter of the pnp transistor 1 is forward biased, causing the latter to be conductive. Therefore, a current flows from the source terminal $V_{DD}$ through the resistor 6, the pnp transistor 1 and the resistor 7 to the source terminal $V_{SS}$. Consequently, the npn transistor 3 is forward biased, so that a portion of the base current of the pnp transistor 1 is derived out. Therefore, a large current continually flows between the source terminals $V_{DD}$ and $V_{SS}$ due to a thyristor comprising the pnp transistor 1 and npn transistor 3. Once this large current is established, it will continue to flow even if the surge input to the output terminal OUT is terminated. In this manner, the IC cannot operate in a mode other than the breakdown mode once this current is established by a negative surge at the OUT terminal.

Similarly, when a positive surge voltage is applied to the output terminal OUT, a current flows between the p+ type drain 102 of the p-MOST A and the n-type substrate 105. Therefore the pnp transistor 2 becomes conductive and a current which is a current flowing between the drain 102 of the p-MOST A and the p-island 106 amplified by the amplification factor $h_{FE2}$ of the transistor 2 flows through the resistor 7 to the terminal $V_{SS}$. With this current, the base-emitter circuit of the npn transistor 3 is forwardbiased and thus the latter becomes conductive causing a current to flow from the source terminal $V_{DD}$ through resistor 5, npn transistor 3, and resistor 8 to the source terminal $V_{SS}$. With this current, the pnp transistor 1 is further forward-biased and supplies a further current to the base of the npn transistor 3. Therefore, a large current continually flows between the terinals $V_{DD}$ and $V_{SS}$ due to a thyristor formed by the pnp transistor 1 and the npn transistor 3, again resulting in the breakdown of the IC.

The formation of parasitic bipolar transistors in the CMOSIC is unavoidable. Thus, any solution to this problem must be based on the premise that the above-mentioned latch-up phenonmenon is unavoidable.

SUMMARY OF THE INVENTION

It is thus an object of the present invention to provide a CMOSIC whose durability against the latch-up phenomenon is improved.

The foregoing and other objects of the present invention are realized by reducing the amplification factor $h_{FE}$ of the parasitic bipolar transistors. A diffusion layer is formed in the MOS devices and is of the same conductivity type as the source thereof. These diffusion layers produce parasitic transistors which lower the amplification factor $h_{FE}$ of the other parasitic transistors to thereby eliminate the occurrence of the latch-up phenomenon.

DETAILED DESCRIPTION OF THE PREFERRED EMBODIMENTS

Figure 1:
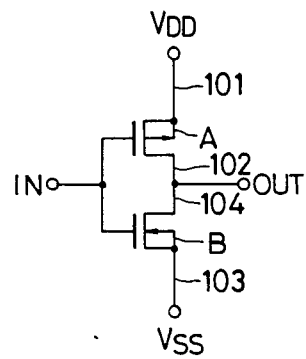
FIG. 1 is a circuit diagram of a minimum unit of a CMOS circuit.
Figure 3:
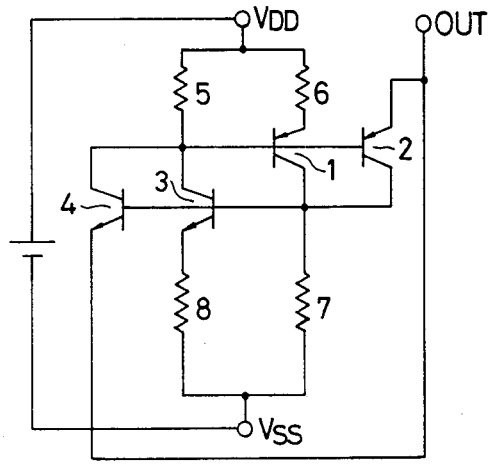
FIG. 3 is an equivalent circuit of the parasitic elements of FIG. 2.
Figure 2:
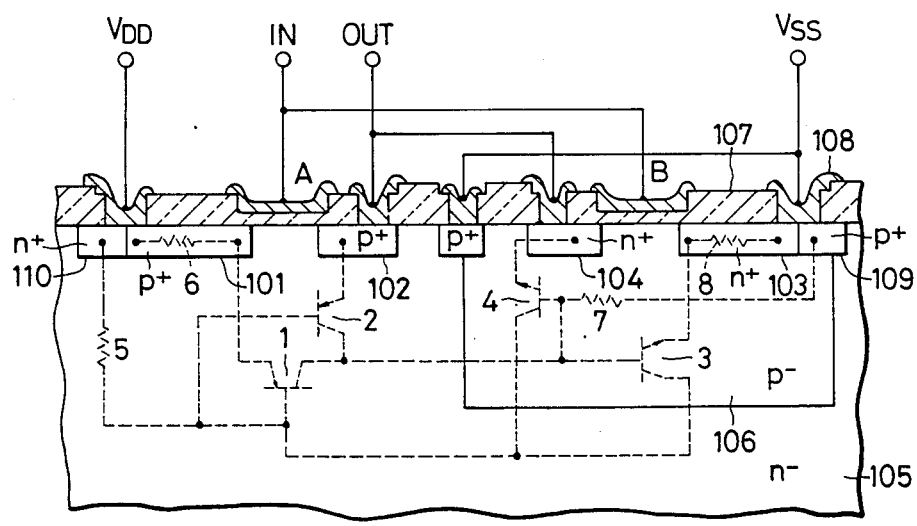
FIG. 2 is a cross-sectional view of an example of the conventional CMOSIC structure including the minimum unit in FIG. 1, together with parasitic elements formed therein.
Figure 4:
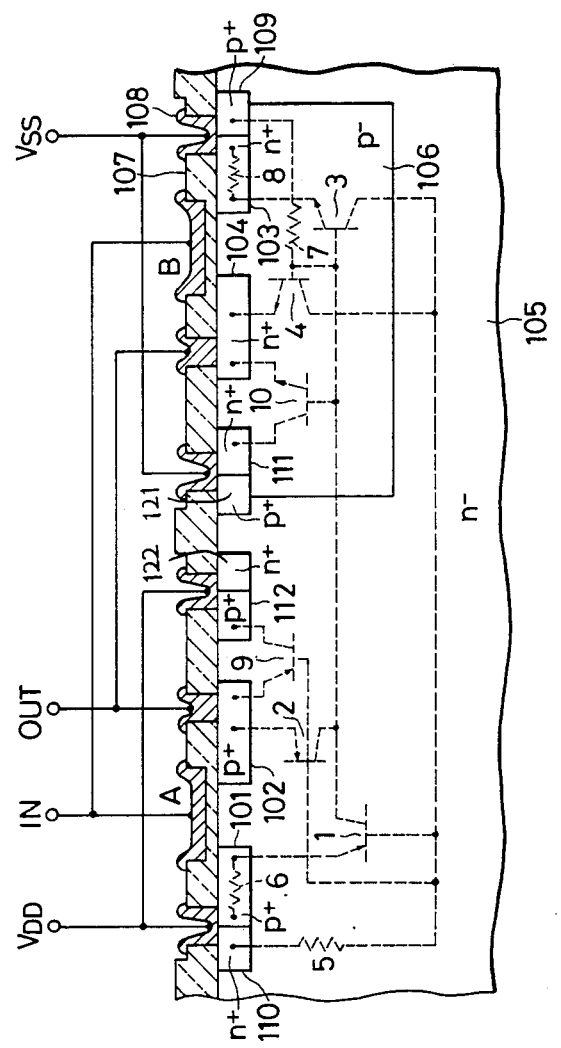
FIG. 4 shows a cross-sectional view of an embodiment of the present invention, together with the parasitic elements formed therein.

FIG. 4 is a cross-sectional view of an embodiment of the present invention in which components similar to those shown in FIG. 2 are indicated by like reference numerals. A detailed description of these similar components is omitted for simplification. In FIG. 4, an n+ diffusion layer 111 facing the drain 104 of the n-MOST B is formed and connected to the source terminal $V_{SS}$, and a p+ diffusion layer 112 facing to the drain 102 of the p-MOST A is formed and connected to the source terminal $V_{DD}$. The formation of the p+ diffusion layer 112 produces a pnp parasitic transistor 9 and the formation of the n diffusion layer 111 produces a npn transistor 10.

Figure 5:
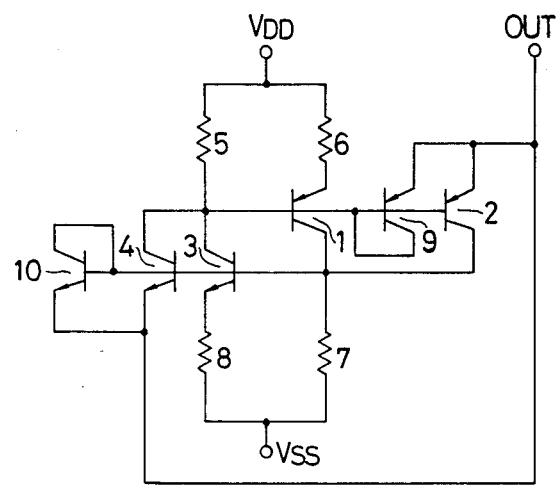
FIG. 5 is an equivalent circuit of the parasitic elements of the embodiment in FIG. 4.

FIG. 5 shows an equivalent circuit of a parasitic circuit formed by all the parasitic elements shown by dotted lines in FIG. 4.

Figure 6A:
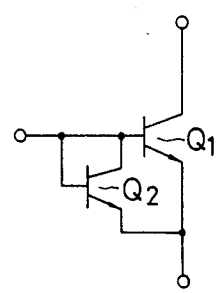
FIGS. 6(a) and 6(b) are circuit diagrams for explaining the reduction in the amplification factors of several of the parasitic elements of FIG. 5.
Figure 6B:
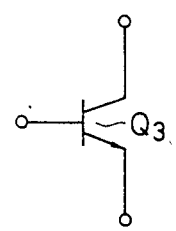

The effects of the newly formed parasitic transistors 9 and 10 will be described with reference to FIGS. 4 and 5. As mentioned before, when a negative surge voltage is applied to the output terminal OUT and the current flows through the collector of the npn transistor 4 (imparting the amplification factor $h_{FE4}$), at the base of the pnp transistor 1, the latch-up phenomenon would normally occur. However, the presence of the npn transistor 10 between the base and the emitter of the npn transistor 4 limits the amplification factor $h_{FE4}$ of the npn transistor 4. This will be explained with reference to FIGS. 6(a) and 6(b). As shown in FIG. 6a, when a transistor $Q_2$ is connected between a base and an emitter of a transistor Q, and amplification factors $h_{FE}$ thereof are 50, respectively, an amplification factor $h_{FE}$ of an equivalent composite transistor $Q_3$ shown in FIG. 6b, becomes 0.8. Applying the equivalent transistor $Q_3$ to the transistors 4 and 10 of FIG. 5, a surge voltage applied thereto does not forward-bias the base-emitter junction of the pnp transistor 1 as previously unless it is extraordinarily high.

Therefore within the normal range of surge voltages, there is no possibility of producing the latch-up phenomenon created in CMOSIC of the prior art. Similarly, when a positive surge voltage is applied to the output terminal OUT, the amplification factor $h_{FE2}$ of the pnp transistor 2 is reduced due to the presence of the pnp transistor 9 such that the base-emitter junction of the npn transistor 3 is not forward-biased and the latch-up phenomenon does not occur.

It should be noted that in the usual case, the amplification factors $h_{FE}$ of the pnp transistor 9 and the npn transistor 10 are large so that (to some extent) a variation of each may not be a serious problem. However, the amplification $h_{FE}$ of these transistors may be increased by reducing the distances between the p+ diffusion layer 112 and the drain 102 of the p-MOST A, and between the n+ diffusion layer 111 and the drain 104 of the n-MOST B, respectively, so long as the breakdown problem is still eliminated. Further, since the parasitic MOSTs (which are field transistors whose threshold voltages are high) are formed between these diffusion layers and the drains, respectively, it is desirable to apply potentials equal to those at the diffusion layers to portions corresponding to gate electrodes on the oxide layer in gate regions of the parasitic MOSTs, respectively.

As described hereinbefore, in the CMOSIC according to the present invention, a third diffusion region of the same conductivity type as that of the respective source diffusion region is formed in facing relation to the drain of each of the MOSTs. This diffusion region forms a by-pass for the base current flowing between a base and an emitter of the parasitic bipolar transistor, which causes the latch-up phenomenon. Thus, the amplification factor $h_{FE}$ of the parasitic transistor is reduced substantially, and the durability of the CMOSIC against the latch-up phenomenon is substantially improved.

What is claimed is:

1. A semiconductor integrated circuit device of the CMOS type, comprising: a semiconductor substrate (105) having an n-type conductivity portion and a p-type conductivity portion (106) in which a p-channel MOS transistor and an n-channel MOS transistor connected in series with the p-channel MOS transistor are respectively formed, said n-channel MOS transistor having a source diffusion region (103) and a drain diffusion region (104) of n-type conductivity, and said p-channel MOS transistor having a source diffusion region (101) and a drain diffusion region (102) of p-type conductivity, said circuit further comprising a third diffusion region (111,112) formed in each of the MOS transistors directly adjacent the drain diffusion region of each, said third diffusion region (111) of said n-channel MOS transistor being of n-type conductivity and forming a first parasitic transistor together with said drain diffusion region of said n-channel MOS transistor and said p-type conductivity portion of said substrate, and being connected to a potential which is commonly connected to said source diffusion region of said n-channel MOS transistor; and said third diffusion region (112) of said p-channel MOS transistor being of p-type conductivity and forming a second parasitic transistor together with said drain diffusion region of said p-channel MOS transistor and said n-type conductivity portion of said substrate, and being connected to a potential which is commonly connected to said source diffusion region of said p-channel MOS transistor; said first and second parasitic transistors operating in conjunction with inherent CMOS parasitic transistors in a manner so as to substantially decrease the amplification factors of the same.

2. A semiconductor in claim 1, wherein a distance between each of said third diffusion regions and said drain diffusion region of each of said MOS transistors is different from that between said source diffusion regions and said drain diffusion region of each of said MOS transistors.

3. A semiconductor circuit as claimed in claim 1 or 2, wherein said semiconductor circuit further comprises fourth diffusion regions (121,122) positioned respectively directly adjacent said third diffusion regions and being of a conductivity type opposite to that of said respective third diffusion regions (111,112), said fourth diffusion regions being respectively electrically connected to their adjacent third diffusion regions.

4. A complementary MOS integrated circuit device, comprising:
   a substrate (105) of a first conductivity type;
   an island (106) of a second conductivity type formed within said substrate;
   a first transistor formed within said island and comprising a source region (103), a gate and a drain region (104), said source and said drain regions being of said first conductivity type;
   a second transistor formed within said substrate and comprising a source region (101), a gate and a drain region (102), said source and said drain regions being of said second conductivity type;
   first (109) and second (121) diffusion areas of said second conductivity type, said first and second diffusion areas being electrically connected to said source of said first transistor, and said second diffusion area (121) being disposed proximate said drain of said first transistor and having a first drain-facing side and a portion in contact with that part of said substrate outside said island;
   third (110) and fourth (122) diffusion areas of said first conductivity type, said third and fourth diffusion areas being electrically connected to said source of said second transistor, and said fourth diffusion area (122) being disposed proximate to said drain of said second transistor and having a first drain-facing side and an opposite island-facing side;
   an insulating layer (107) formed on both said substrate and said island;
   a first voltage source, a second voltage source, an input terminal and an output terminal;
   a plurality of first metal contact passing through said insulating layer for establishing electrical connections between said first and second diffusion areas and said first voltage source, between said third and fourth diffusion areas and said second voltage source, and between said drains and said output terminal;
   a plurality of second metal contacts formed on said insulating layer to form said gates, said gates being connected to said input terminal; and
   first and second diffusion regions (111,112), said first diffusion region (111) being of said first conductivity type and said second diffusion region (112) being of said second conductivity type, said first diffusion region being connected to said second diffusion area (121) at said drain-facing said thereof, and being directly adjacent said drain region (104) of said first transistor, and said second diffusion region (112) being connected to said fourth diffusion area (122) at said drain-facing side thereof, and being directly adjacent said drain region (102) of said second transistor.

5. A device as claimed in claim 4, said first diffusion region forming a first parasitic transistor together with said island and said drain of said first transistor, and said second diffusion region forming a second parasitic transistor together with said substrate and said drain of said second transistor.

6. A device as claimed in claim 5, wherein said first parasitic transistor has an emitter and base in common with a first CMOS parasitic transistor comprised of said island, said substrate and said drain of said first transistor, to reduce the amplification factor of said first CMOS parasitic transistor; and wherein said second parasitic transistor has an emitter and base in common with a second CMOS parasitic transistor comprised of said substrate, said island and said drain of said first transistor, to reduce the amplification factor of said second CMOS parasitic transistor.

* * * * *